US009698759B2

(12) United States Patent
Nestler et al.

(10) Patent No.: US 9,698,759 B2
(45) Date of Patent: *Jul. 4, 2017

(54) CHARGE SHARING TIME DOMAIN FILTER

(71) Applicant: ANALOG DEVICES, INC., Norwood, MA (US)

(72) Inventors: Eric Nestler, Cambridge, MA (US); Jeffrey Venuti, Bedford, MA (US); Vladimir Zlatkovic, Belmont, MA (US); Kartik Nanda, Cambridge, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/269,647

(22) Filed: May 5, 2014

(65) Prior Publication Data

US 2015/0381146 A1    Dec. 31, 2015

Related U.S. Application Data

(63) Continuation of application No. 13/490,110, filed on Jun. 6, 2012, now Pat. No. 8,717,094, and a (Continued)

(51) Int. Cl.
*H01B 1/10* (2006.01)
*H03H 15/02* (2006.01)
(Continued)

(52) U.S. Cl.
CPC ......... *H03H 15/02* (2013.01); *G01R 27/2605* (2013.01); *G06F 17/14* (2013.01); (Continued)

(58) Field of Classification Search
CPC ...................................................... H01B 1/10
See application file for complete search history.

(56) References Cited

U.S. PATENT DOCUMENTS

| 4,077,035 A | 2/1978 | Yee |
| 4,399,426 A | 8/1983 | Tan |

(Continued)

FOREIGN PATENT DOCUMENTS

| CN | ZL201280034217.3 | 11/2016 |
| DE | 10-2006-015762 | 10/2007 |

(Continued)

OTHER PUBLICATIONS

D'Mello, Design Approaches to Field-Programmable Analog Integrated Circuits, Analog Integrated Circuits and Signal Processing, 1998, 28 pages.

(Continued)

*Primary Examiner* — Hai L Nguyen
(74) *Attorney, Agent, or Firm* — Patent Capital Group

(57) ABSTRACT

An approach to time domain filtering uses a passive charge sharing approach to implement an infinite impulse response filter. Delayed samples of an input signal are stored as charges on capacitors of a first array of capacitors, and delayed samples of the output signal are stored as charges on capacitors of a second array of capacitors. Outputs are determined by passively coupling capacitors of the first and second arrays to one another, and determining the output according to a total charge on the coupled capacitors. In some examples, a gain is applied to the total charge prior to storing the output on the second array of capacitors. In some examples, a charge scaling circuit is applied to the charges stored on the arrays prior to coupling capacitors to form the output.

20 Claims, 10 Drawing Sheets

Related U.S. Application Data continuation-in-part of application No. PCT/US2011/048278, filed on Aug. 18, 2011.

(60) Provisional application No. 61/493,893, filed on Jun. 6, 2011.

(51) Int. Cl.
    *G01R 27/26* (2006.01)
    *G06G 7/19* (2006.01)
    *G06F 17/14* (2006.01)
    *G01D 5/24* (2006.01)
    *G01R 31/02* (2006.01)

(52) U.S. Cl.
    CPC ............... *G06G 7/19* (2013.01); *G01D 5/24* (2013.01); *G01R 31/028* (2013.01)

(56) References Cited

U.S. PATENT DOCUMENTS

| | | |
|---|---|---|
| 4,551,686 A | 11/1985 | Benzinger |
| 5,235,335 A | 8/1993 | Hester |
| 5,369,407 A | 11/1994 | Yung et al. |
| 5,581,252 A | 12/1996 | Thomas |
| 5,684,478 A | 11/1997 | Panaoussis |
| 6,054,945 A | 4/2000 | Doyle |
| 6,414,541 B1 | 7/2002 | Arvidsson |
| 6,859,762 B2 | 2/2005 | Mawet |
| 7,199,740 B1 | 4/2007 | Ferguson, Jr. |
| 7,405,681 B2 | 7/2008 | Jonsson et al. |
| 7,539,721 B2 | 5/2009 | Belveze et al. |
| 7,636,012 B2 * | 12/2009 | Iida ............... H03H 19/004 327/554 |
| 7,791,407 B2 | 9/2010 | Muhammad et al. |
| 7,804,434 B2 | 9/2010 | Stoutjesdijk |
| 7,965,135 B2 | 6/2011 | Yoshizawa et al. |
| 8,067,972 B2 | 11/2011 | Iida |
| 8,188,753 B2 | 5/2012 | Nestler et al. |
| 8,717,094 B2 * | 5/2014 | Nestler ............... H03H 15/02 327/551 |
| 2003/0018452 A1 | 1/2003 | Mawet |
| 2003/0050027 A1 | 3/2003 | Muhammad |
| 2006/0269312 A1 | 11/2006 | Muraishi |
| 2008/0048781 A1 | 2/2008 | Wagner |
| 2008/0057900 A1 | 3/2008 | Fang et al. |
| 2008/0129573 A1 | 6/2008 | Mueck et al. |
| 2009/0002066 A1 | 1/2009 | Lee |
| 2009/0322580 A1 | 12/2009 | Belveze et al. |
| 2010/0060500 A1 | 3/2010 | Schatzberger et al. |
| 2010/0198898 A1 | 8/2010 | Pan |
| 2010/0223225 A1 | 9/2010 | Vigoda et al. |
| 2010/0225419 A1 * | 9/2010 | Pan ............... H03H 15/02 333/174 |

FOREIGN PATENT DOCUMENTS

| | | |
|---|---|---|
| EP | 933870 | 8/1999 |
| EP | 1-018-806 | 7/2000 |
| WO | 2012/170533 | 12/2012 |

OTHER PUBLICATIONS

Martinez, Discret Time Filters, Wiley 1999, 14 pages.
Rivert, A 65nm CMOS RF Front End Dedicated to Software Radio in Mobile Terminals, Proc. SDR 2008, 20 pages.
Lacy, Cameron B., "Design of a Programmable Switched-Capacitor Analog FIR Filer," [online: retrieved Nov. 14, 2012 https://tspace.library.utoronto.ca/bitstream/1807/14967/1/MQ46200.pdf] XP55044242 (1999), 131 pages.
English Translation of KR Office Action issued in KR 10-2014-7000350 mailed Oct. 21, 2015, 6 pages.
2nd Office Action issued in KR Patent Application Serial No. 10-2014-7000350 mailed Apr. 21, 2016, 4 pages.
English Translation of 2nd Office Action issued in KR Patent Application Serial No. 10-2014-7000350 mailed Apr. 21, 2016, 2 pages.
International Search Report and Written Opinion issued in International Application Serial No. PCT/US2012/041101 mailed Nov. 27, 2012, 13 pages.

* cited by examiner

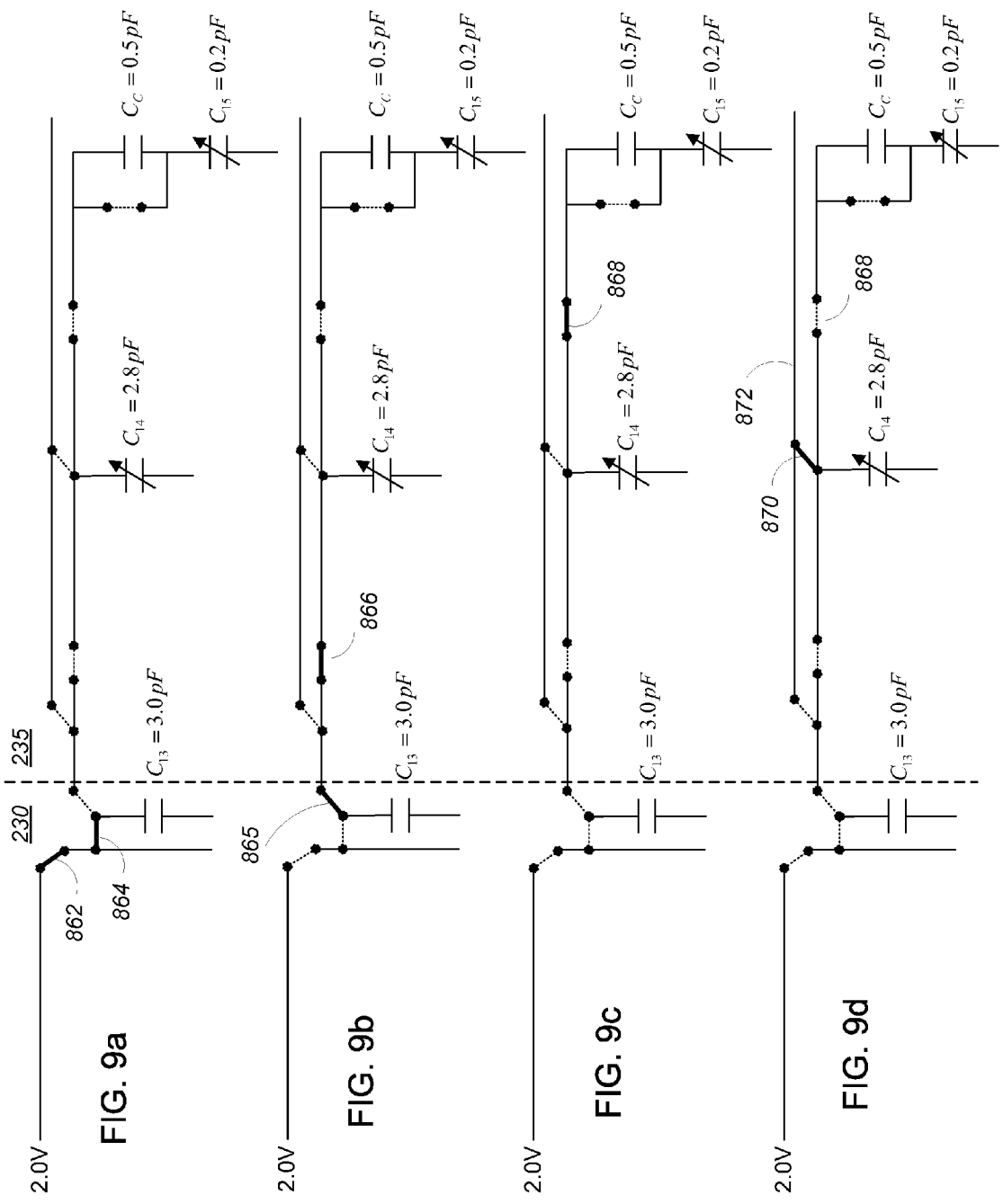

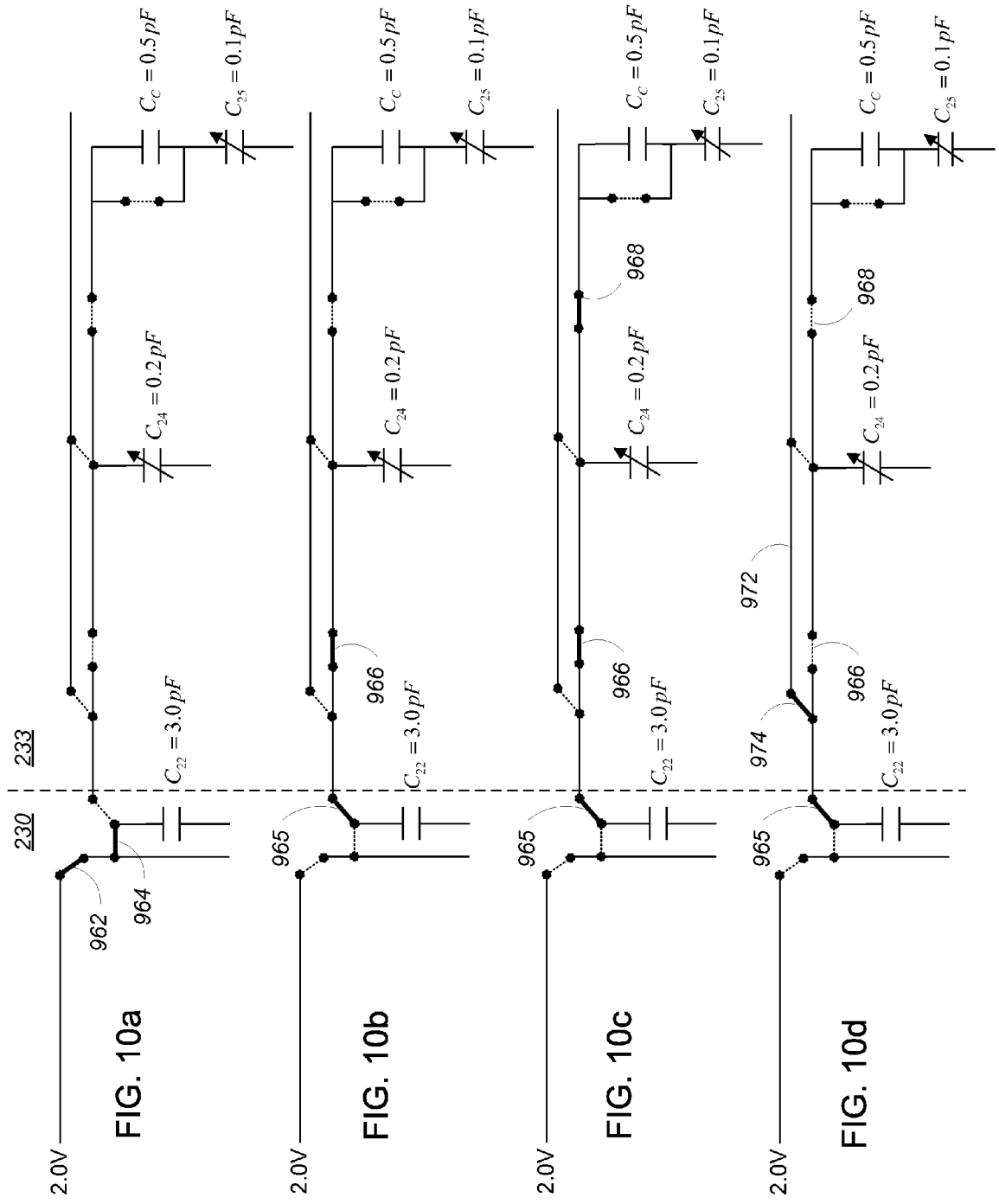

CHARGE SHARING TIME DOMAIN FILTER

CROSS-REFERENCE TO RELATED APPLICATIONS

This application is a continuation of U.S. Pat. No. 8,717,094, which claims priority to U.S. Provisional Application No. 61/493,893 titled "CHARGE SHARING IIR FILTER" filed Jun. 6, 2011, and which is a continuation-in-part of PCT Application No. PCT/US11/48278, titled "CHARGE SHARING ANALOG COMPUTATION CIRCUITRY AND APPLICATIONS", filed on Aug. 18, 2011, and published as WO2012024507 on Feb. 23, 2012, the contents of each is incorporated herein by reference.

This application is related to, but does not claim the benefit of the filing date of U.S. Pat. No. 8,188,753, titled "ANALOG COMPUTATION", issued on May 29, 2012, and U.S. patent application Ser. No. 13/482,112, filed on May 29, 2012, which are also incorporated herein by reference.

BACKGROUND

This invention relates to time domain filtering and filters that make use of charge sharing techniques.

Time domain filters are generally classified as either finite impulse response filters (FIR filters) or infinite impulse response filters (IIR filters). FIR filters compute their output signals based solely on a finite history of values of the input signal while IIR filters compute their output signals based on values of the input signal and previous values of the output signal (i.e., IIR filters are recursive).

Conventional digital time domain filters receive a digitized, discrete-time (e.g., sampled) input signal and generate a digitized, discrete-time output signal which includes an altered version of the sampled input signal. Such filters are generally implemented using digital hardware such as dedicated digital signal processing chips (DSPs). Various designs of such filters and their associated advantages, disadvantages, and applications are well known in the art and are not further discussed in this application.

Discrete time, or more generally discrete sample (e.g., spatial sample), time domain filtering has been implemented using analog signals. For example, a wide range of what are often referred to as "switched capacitor" filters are used, generally making use of a technique of charge transfer using active amplifier stages, whereby a signal represented by charge on capacitive elements at an input of an amplifier stage is transferred to charge on capacitive elements at an output of the amplifier stage. An advantage of circuitry that directly processes analog signals is avoiding the need to convert the signal levels to digital form and reduced circuit resources required to process the signal levels in analog form and/or higher clocking rates, as compared to use of a digital arithmetic unit of digital signal processor.

Another approach to discrete time analog signal processing makes use of active elements for combining analog signals. For example, one approach to implementing a finite impulse response filter is to use a capacitor array (e.g., a tapped delay line) to store signal values, and a set of analog multipliers with controllable gain that scale the voltages at the outputs of the array, and/or integrators prior to combination to determine the output of the filter.

SUMMARY

In one aspect, in general, an approach to time domain filtering uses a passive charge sharing approach to implement an infinite impulse response filter. Delayed samples of an input signal are stored as charges on capacitors of a first array of capacitors, and delayed samples of the output signal are stored as charges on capacitors of a second array of capacitors. Outputs are determined by passively coupling capacitors of the first and second arrays to one another, and determining the output according to a total charge on the coupled capacitors. In some examples, a gain is applied to the total charge prior to storing the output on the second array of capacitors. In some examples, a charge scaling circuit is applied to the charges stored on the arrays prior to coupling capacitors to form the output.

In another aspect, in general, a signal processing device has a first discrete time analog signal filter section. This first section includes an input for accepting a time series of input signal values, an output for providing a time series of output signal values, an analog signal storage section comprising a plurality of capacitors, and a number of switching elements. The switching circuit elements are configurable to (a) charge successive subsets of capacitors of a first plurality of subsets of the plurality of capacitors according to successive values of the input signal values, (b) couple successive subsets of two or more capacitors of a second plurality of subsets of the plurality of capacitors to form successive values of a time series of intermediate signal values, and (c) charge successive subsets of two or more capacitors of a third plurality of subsets of the plurality of capacitors according to successive values of the intermediate signal values. The section also includes circuitry for forming the time series of output signal values according to the time series of intermediate values, and control logic for controlling configuration of the switching circuit elements in successive phases of a clock signal to form the time series of output signal values as an application of a desired infinite impulse response filter to the time series of input signal values.

Aspects can include one or more of the following features.

The signal storage section comprises a first storage section and a second storage section, wherein (a) the subsets of capacitors of the first plurality of subsets are formed from capacitors of the first storage section, (b) each of the subsets of the second plurality of subsets is formed from capacitors in both the first storage section and the second storage section, and (c) the subsets of the third plurality of subsets are formed from capacitors of the second storage section, and The device further includes active circuitry for charging the successive subsets of the third plurality of subsets of capacitors according to the successive intermediate signal values.

The switching circuit elements are configurable to cause at least some of the charges on the capacitors in the storage section to be scaled according to configurable factors.

The device further includes at least a second discrete time analog signal filter section coupled to the first filter section such that the time series of output values of the first section form a time series of input values for the second section.

The first filter section and the second filter section each are configurable to implement infinite impulse response filters.

The device further includes at least a second discrete time analog signal filter section coupled to the first filter section such that a time series of output values of the second section forms the time series of input values for the first section.

The second filter section includes an FIR decimation filter.

The first filter section implements an infinite impulse response filter with delay terms limited to a delay of samples, and the first storage section includes an array of capacitors and the second storage section includes an array of capacitors.

The device further includes an input for a clock signal, and wherein the control logic comprises digital storage for configuration data, and logic circuitry for combining the clock signal and the configuration data to control the switch circuit elements.

Aspects may include one or more of the following advantages.

Passive scaling circuits based on charge sharing techniques can be used to implement time and frequency domain digital filter designs. Such implementations can provide low power and filtering with a small footprint in signal processing applications such as hearing aids or the front ends of analog to digital converters (ADCs).

As example applications, filters using such charge sharing can be used as anti-alias filters to prevent aliasing in acquired signals, notch filters which can remove unwanted signal components such as line frequency hum (e.g., 60 Hz hum). In other examples, high-pass filters using charge sharing techniques can be used to eliminate baseline wander (i.e., DC offset) in signals before they are digitized.

In some examples, the approaches described above can be used to implement a configurable digital filter design on a self-contained device such as an integrated circuit. Use of such an integrated circuit could allow system designers to save cost and limit power consumption by avoiding the need to use digital signal processing hardware.

Other features and advantages of the invention are apparent from the following description, and from the claims.

DESCRIPTION OF DRAWINGS

FIGS. 9a-9d illustrate a first mode for applying a single filter coefficient of the configurable second order time domain IIR filter.
FIGS. 10a-10d illustrate a second mode for applying a single filter coefficient of the configurable second order time domain IIR filter.

DESCRIPTION

1 System Overview

Figure 1:
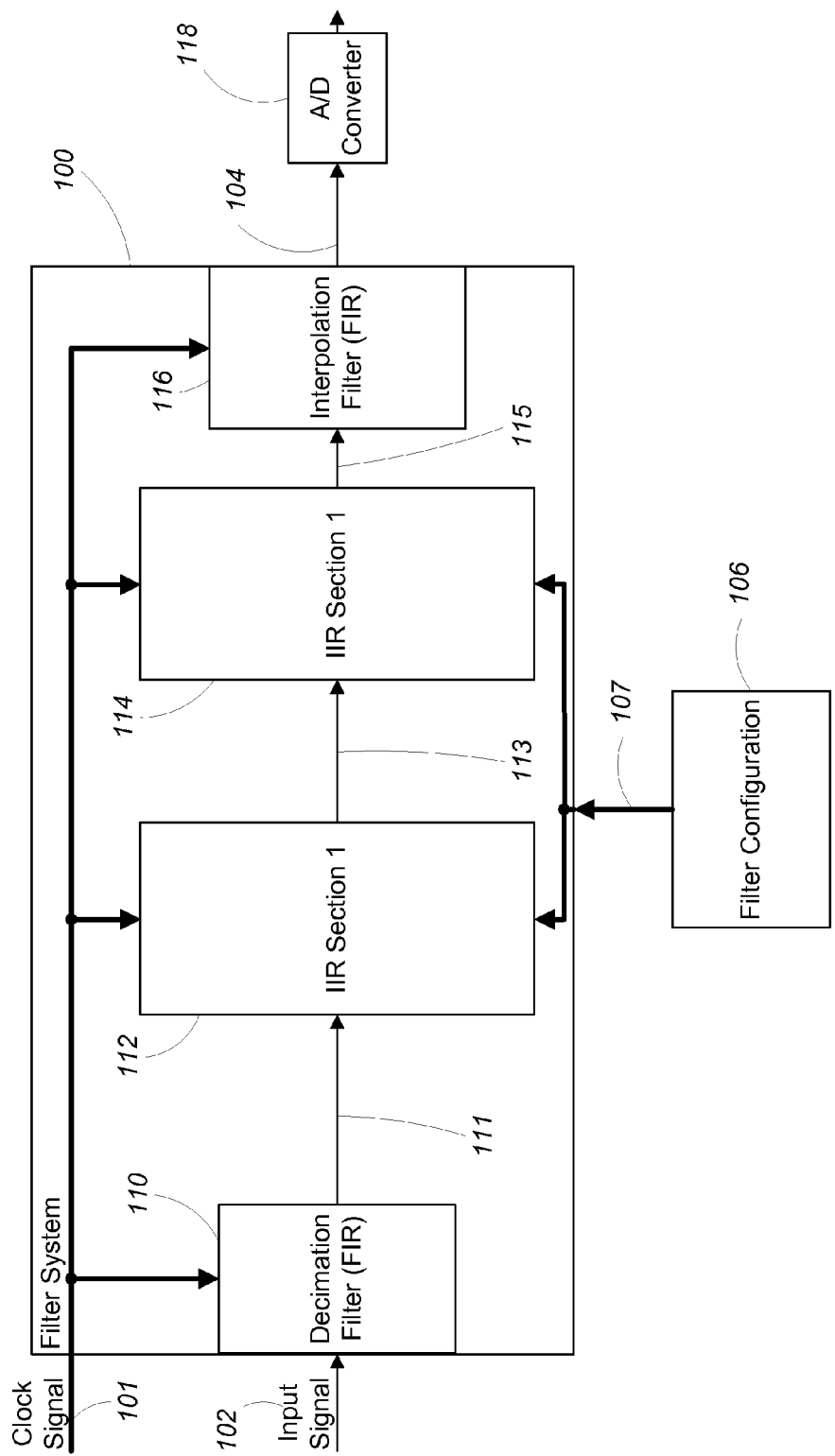
FIG. 1 is a time domain filter system.

Referring to FIG. 1, an exemplary a filter system 100 receives an analog input signal 102 and a clock signal 101 as inputs, and applies a discrete time filter to the input signal to provide an output signal 104. The filter system 100 implements a charge sharing discrete time analog filter which processes the input signal 102 according to a filter configuration instruction/data 107 provided from an external filter configuration module 106. In this example, the output signal 104 is passed to a downstream component, in this case, an analog to digital converter 118. It should be understood that the filter system 100 is merely one example of a configuration of such a filter provided to illustrate the techniques used, and it should be understood that other examples have different arrangements of these and/or other modules.

The exemplary filter system 100 is assumed to receive a band-limited continuous time signal, for example, having been filtered by a conventional continuous time analog filter prior to being received by the filter system. In this example, the first stage of the system is a charge sharing discrete time decimation filter 110 which samples the input signal 102 at a first sampling rate, and provides discrete time analog values at a second lower sampling rate, for example, with an 8× decimation rate. The decimation filter 110 is followed by a first charge sharing discrete time second order IIR filter 112 cascaded with a second charge sharing discrete time second order IIR filter 114, each of which filters the signal at rate of the output of the decimation filter. The output of the second IIR filter is then passed to a charge sharing discrete time interpolation filter 116, which outputs an discrete time interpolation of the signal at a third sampling rate (e.g., at the same sampling rate as the input is sampled).

As introduced above, the decimation filter 110 reduces the sampling rate of the input signal 102 by an integer factor (e.g., by a factor of 8). The decimation filter 110 first samples the input signal 102 at a sample rate which is dictated by the clock 101 by charging a different set of sample capacitors (not shown) for each cycle of the clock 101. The decimation filter 110 then generates a decimated signal 111 which has a decimated sampling rate that differs from the clock frequency by an integer value. To avoid aliasing, the decimation filter 110 also applies a low-pass filter to the anti-aliased signal 108 to remove any frequencies which are greater than ½ of the decimated sampling rate.

In some examples, the charge sharing discrete time decimation filter 110 is implemented as a charge sharing discrete time FIR filter as is described in U.S. Pat. No. 8,188,753 titled "Analog Computation" which is incorporated herein by reference. One approach described in the previous patent is an N-tap FIR filter implemented using $N^2$ capacitors, whose values are chosen (e.g., fabricated to be fixed) to match the coefficients of a desired filter. For example, in the case of the decimation filter for the present example, an N=128 tap lowpass window filter may be used. Note that in the technique described in the previous patent, each input sample is used to charge N of the $N^2$ capacitors, and each output is determined by charge sharing a different N capacitors. In this case with decimation by a factor K (e.g., K=8), although each output is determined by sharing charges on N capacitors, because only one in K outputs are required, each input only has to charge N/K capacitors, and only $N^2/K$ total capacitors are needed to store input values before combination through sharing.

In general, various examples of the filter systems include infinite-impulse-response modules. These modules can have fixed characteristics, or can be configurable prior to operation. In the exemplary filter system shown in FIG. 1, the decimated signal 111 is passed to the first charge sharing discrete time analog IIR filter 112 (referred to as the 'first biquad' 112). As is well known in the art, a second order IIR filter can be represented in the Z-transform domain by the equation:

$$h(z) = \frac{b_0 + b_1 z^{-1} + b_2 z^{-2}}{1 + a_0 z^{-1} + a_1 z^{-2}}$$

with the filter output, y[n], represented in the discrete time domain by the equation:

$$y[n]=b_0x[n]+b_1x[n-1]+b_2x[n-2]-a_1y[n-1]-a_2y[n-2]$$

Before the filtering operation of the system 100 the desired values of the coefficients $b_0$, $b_1$, $b_2$, $a_1$, and $a_2$ are processed by the filter configuration module 106 to determine the configuration instruction/data 107, which are passed to the system 100. During the filtering operation, the first IIR filter 112 generates a first filtered signal 113 by filtering the decimated signal 111 using charge sharing discrete time analog filtering techniques, which are described in detail below.

The first filtered signal 113 is passed to the second charge sharing discrete time analog filter, which in this example is also an IIR filter 114 (referred to as the 'second IIR filter' 114) which generates a second filtered signal 115. The second IIR filter 114 has the same basic structure as the first IIR filter 112. The coefficients of the second second order IIR filter 114 (i.e., $b_0$, $b_1$, $b_2$, $a_1$, and $a_2$) are assigned separately from the coefficients of the first IIR filter 112 by the filter configuration module 106. By cascading the two second order IIR filters 112, 114 as is shown in FIG. 1 a fourth order IIR filter can be implemented. As introduced above, in other examples, even more filters are cascaded and/or otherwise interconnected to implement other types of filters.

The second filtered signal 115 is passed to the charge sharing discrete time interpolation filter 116 which generates the output signal 104 by up-sampling (e.g., by a factor of 8) by interpolating the second filtered signal 115. As with the decimation filter, the interpolation filter 116 can implemented as a charge sharing discrete time FIR filter as is described in U.S. Pat. No. 8,188,753 titled "Analog Computation". One approach described in this patent is a N-tap FIR filter implemented using $N^2$ capacitors, whose values are chosen (e.g., fabricated to be fixed) to match the coefficients of a desired filter. In some examples, each output of the second IIR filter is replicated K times, before filtering, while in other examples, each output of the IIR filter is padded with K−1 zero values before the next output of the IIR filter. In one example of such an interpolation filter, a windowed ideal FIR filter is used. In another example, linear interpolation of the samples at K times the rate of the IIR filters can be implemented with an N=2K point FIR filter. Each output sample of IIR filter then charges N capacitors, and each interpolated output sample is formed by charge sharing of 2 capacitors, thereby making use of an array of 2K by 2 capacitors. Other forms of interpolation filtering, which do not necessarily make use of charge sharing can also be used. In some examples, the interpolation filter 116 is adaptive to match the characteristics of the output signal.

In some examples, the exemplary filter system 100 described above is implemented as a separate package which can be included as a module in larger systems. For example, the filter system can be implemented as an integrated circuit which is packaged as a dual in line package (DIP).

2 Infinite Impulse Response (IIR) Filters

Having described the exemplary filter system 100 above, we now describe the general approach to forming infinite impulse response filters, of which the IIR filters 112 and 114 of the system 100 are examples.

2.1 Fixed IIR Filter Architecture

Figure 2:
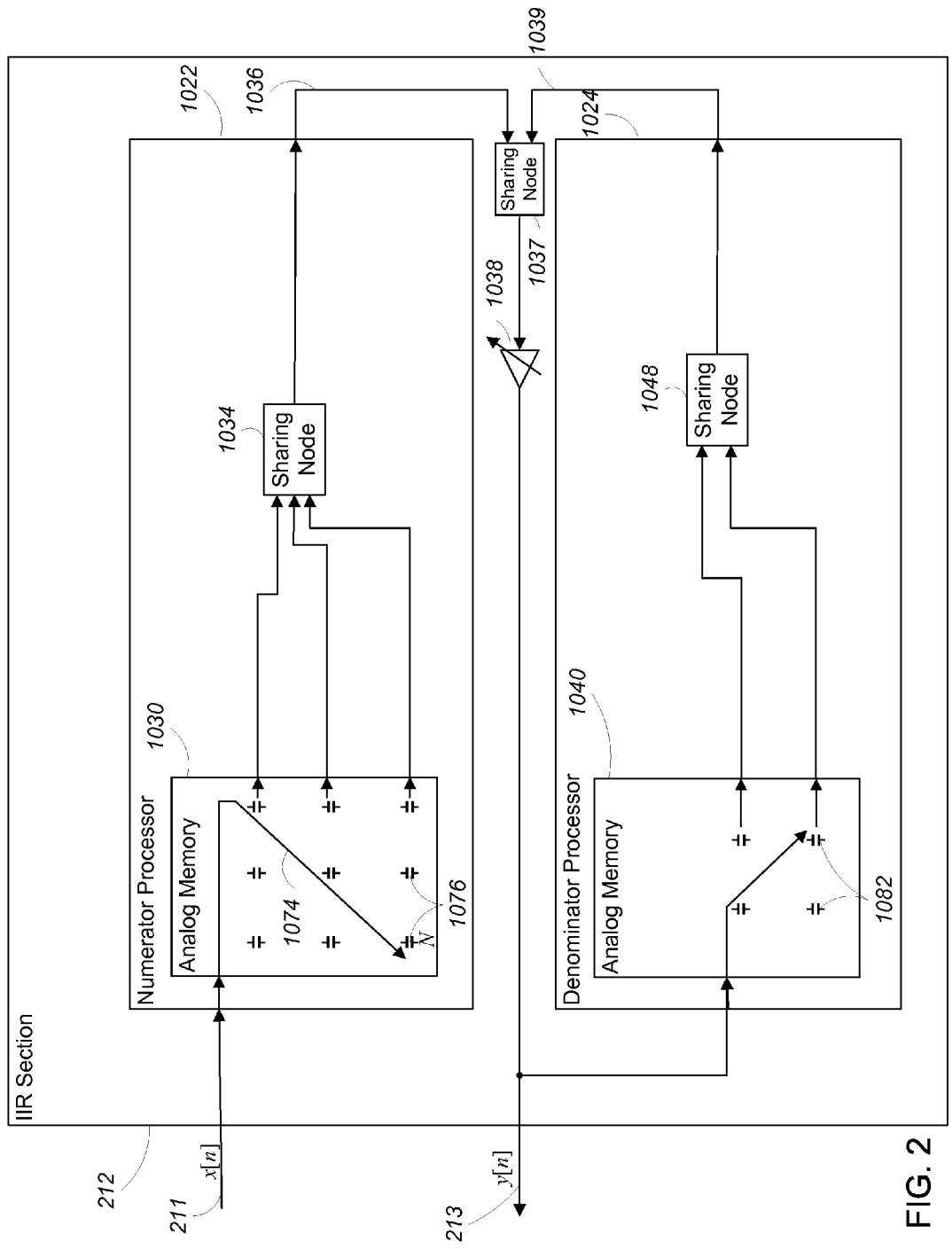
FIG. 2 is a fixed second order time domain IIR filter.

Referring to FIG. 2, a fixed IIR filter 212 (illustrated here as a second order IIR filter (N=2) structure, as in FIG. 1, understanding that this is just an example of possible numerator and denominator polynomial degrees) receives an input signal, x[n] 211 and filters the input signal, x[n] 211 according to a predetermined, fixed transfer function $$h(z) = \frac{b_0 + b_1 z^{-1} + b_2 z^{-2}}{1 + a_0 z^{-1} + a_1 z^{-2}}$$

to generate a filtered output signal, y[n] 213. The IIR filter 212 is a substantially passive circuit in that it includes few (i.e., one) active gain element in the signal path. The IIR filter 212 includes a passive numerator processor 1022, an amplifier 1038, and a passive denominator processor 1024, which are described below.

The input signal, x[n] 211 is first passed to the numerator processor 1022. The numerator processor 1022 includes a first analog memory 1030, which for a numerator degree N has $(N+1)^2$ capacitors. In this fixed filter structure, the capacitors are chosen according to the coefficients $b_0$ to $b_N$. For example, the capacitors are indexed from (0,0) to (N, N), and the input time n charges capacitors (k, (n−k) mod (N+1)), for k=0, . . . , N, illustrated by the diagonal line 1074 through the analog memory in FIG. 2.

In determining the output of the numerator processor 1022 for time n, N+1 capacitors of the numerator processor, with index values (k, n mod (N+1)), for k=0, . . . , N (forming a column) are coupled via a sharing node 1034, which permits bidirectional flow of charge between its ports as voltage on the coupled capacitors equilibrates. In this fixed structure, the capacitors are chosen such that the size of the capacitors with index (k, *) have values proportional to $b_k$. Due to the differing capacitances of the capacitors 1076 in the first analog memory 1030, a different amount of charge is generally stored on each capacitor 1076 included in the diagonal line 1074. Thus, the charge stored on each capacitor 1076 can be seen as a weighted input sample of the input signal x[n]. The charges of the capacitors 1076 included in a column of capacitors 1076 of the first analog memory 1030 represent a weighted time series of the input signal (i.e., $b_0x[n]$, $b_1x[n-1]$, and $b_2x[n-2]$). The charges on the column of capacitors 1076 are coupled to the sharing node 1034 which essentially acts as presenting a shared total charge proportional to $b_0x[n]+b_1x[n-1]+b_2x[n-2]$.

The numerator output signal 1036 is passed to an output sharing node 1037 along with a denominator output signal 1039, which as described further below essentially presents a charge proportional to $-a_1y[n-1]-a_2y[n-2]$. The output sharing node 1037 combines the numerator output signal 1036 and the denominator output signal 1039 by essentially further sharing charges and passes the result to an amplifier 1038. Note that the voltage provided to the amplifier is proportional to the desired $$y[n]=b_0x[n]+b_1x[n-1]+b_2x[n-2]-a_1y[n-1]-a_2y[n-2]$$

The amplifier scales the voltage by a predetermined gain factor, resulting in a filtered output signal, y[n] 213.

Note that the sharing nodes described above are not necessarily explicit in the circuit layout of the IIR filter 212 and can equivalently be replaced by a bus structure (i.e., two wires/traces for a differential signal implementation).

The filtered output signal, y[n] 213 is also fed back as an input to the denominator processor 1024. The denominator processor 1024 implements the denominator portion of the filter equation shown above (i.e., $-a_1 y[n-1] - a_2 y[n-2]$), resulting in the denominator output 1039. The denominator processor 1024 includes a second analog memory 1040 (of size N by N) and a sharing node 1048.

The second analog memory 1040 receives the filtered output signal, y[n] 213 as input and stores a time series of samples of the filtered output signal, y[n] 213. In particular, the filtered output signal, y[n] 213 is stored in a diagonal line 1080 of capacitors 1082 in the second analog memory 1040. For example, the capacitors are indexed from (0,0) to (N−1, N−1), and the output y[n] charges capacitors (k, (n+1−k) mod N), for k=0, . . . , N−1, illustrated by the diagonal line through the analog memory in FIG. 2.

In this fixed structure, the capacitors are chosen such that the size of the capacitors with index (k,*) have values proportional to $a_{k+1}$. Due to the differing capacitances of the capacitors 1082 in the second analog memory 1040, a different amount of charge may be stored on each capacitor 1082 included in the diagonal line 1080. Thus, the charge stored on each capacitor 1082 can be seen as a weighted input sample of the filtered output signal, y[n] 213. The charges of the capacitors 1082 included in a column of capacitors 1082 of the second analog memory 1040 represent a weighted time series of the filtered output signal (i.e., $a_1 y[n-1]$, and $a_2 y[n-2]$). The charges on the column of capacitors 1082 are passed to the sharing node 1048 where they are combined to generate a denominator output signal 1039 which essentially represents a charge proportional to $-a_1 y[n-1] - a_2 y[n-2]$.

As is described above, the denominator output 1039 is passed to the output sharing node 1037 along with the numerator output 1036. By selecting the gain of the amplifier 1038 and the proportionality constants relating the filter coefficients to the capacitor sizes appropriately, the output of the sharing node 1037 is a voltage proportional to the desired output $$y[n] = b_0 x[n] + b_1 x[n-1] + b_2 x[n-2] - a_1 y[n-1] - a_2 y[n-2].$$

Note that the arrangement of capacitors can be modified, essentially by permuting the locations of the capacitors is a rectangular array, for example, for that the input charges capacitors in one row, and output is determined by capacitors in one column. However, by arrangement of the capacitor values, the same functionality can be obtained.

There are alternative approaches to providing the voltage gain of amplifier 1038. One approach is to amplifying the total charge sharing output is to use a charge transfer approach in which the total charge on these shared capacitors is transferred to a capacitor with a capacitance smaller than the net capacitance of the shared capacitors, thereby providing a voltage gain.

3 Configurable IIR Architecture

One approach to providing a configurable IIR filter architecture, which will not be discussed further, is to simply make use of memory arrays of configurable capacitors in the analog memories shown in FIG. 2. For example, each capacitor may include set (e.g., 8) of capacitors that scale as factors of 2, thereby providing a discrete set of possible coefficient values (e.g., 256 different coefficient values). In some implementations, the degree of configurability may not be sufficient or the range of capacitor sizes required to be fabricated may result in undesirable characteristics (e.g., circuit size, noise, etc.).

A configurable approach for IIR filters described in detail below makes use of analog memories with fixed and uniform capacitors, for example, with all $(N+1)^2$ and $N^2$ capacitors having the same value. Generally, prior to sharing charges from the numerator and denominator analog memories, modified charges are formed using a multiple phase charge scaling circuit approach shown in PCT Application No. PCT/US11/48278, titled "CHARGE SHARING ANALOG COMPUTATION CIRCUITRY AND APPLICATIONS", thereby providing a configurable scaling of the charges stored in the analog memories to implement desired IIR filter transfer functions.

Figure 3:
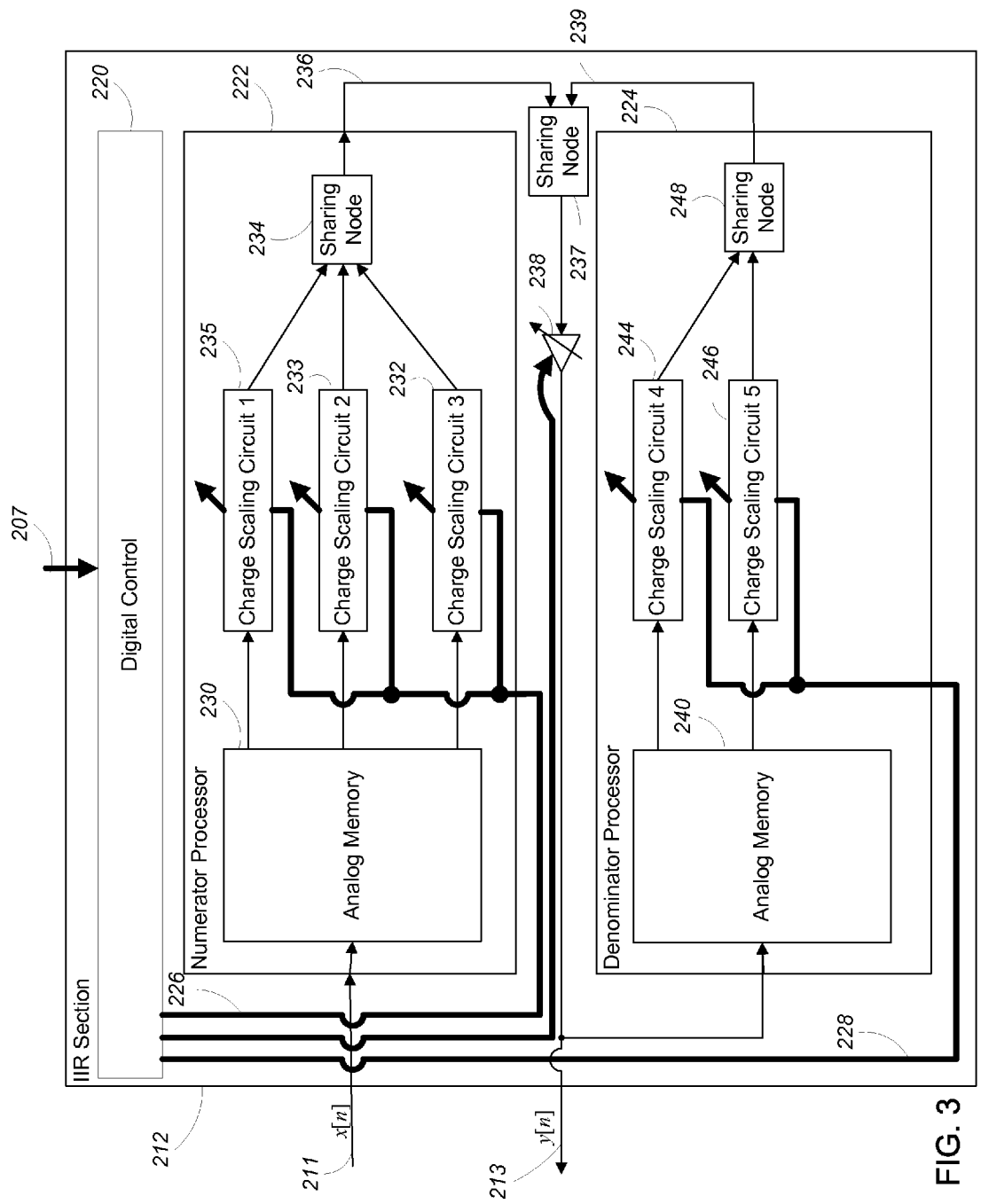
FIG. 3 is a configurable second order time domain IIR filter.

Referring to FIG. 3, a configurable IIR filter, illustrated for the N=2 degree as a second order IIR filter 212 receives an input signal, x[n] 211 and a configuration instruction 207 as inputs. The IIR filter 212 is configured as described below by the configuration instructions/data 206 to implement a specified transfer function. After the IIR filter 212 is configured, the IIR filter 212 generates a filtered output signal, y[n] 213. The IIR filter 212 includes a digital control module 220, a numerator processor 222, an amplifier 238, and a denominator processor 224.

The digital control module 220 receives the configuration instructions/data 207 and uses it to generate a numerator configuration instructions/data 226 for the numerator processor 222, a denominator configuration instructions/data 228 for the denominator processor 224 and an amplifier configuration instruction 229 for the amplifier 238.

The numerator processor 222 includes a first analog memory 230 of $(N+1)^2$ equal capacitors, and (N+1) charge scaling circuits 232, 233, 235 and a charge sharing node 234. The charge scaling circuit is a configurable passive scaling circuit that provides hybrid behavior using different sequences of charge sharing phases, implemented using switches that couple successive sets of capacitors in the circuit.

During a filtering operation, the first analog memory 230 receives the input signal 211 and stores a time series of samples of the input signal, x[n] 211. As is described in more detail below, the analog memory 230 includes a number of capacitors in which the time series of the input signal 211 is stored. In the IIR filter 212 of FIG. 3, the time series stored by the first analog memory 230 of the numerator processor 222 in a manner similar to that for the fixed filter shown in FIG. 2, with the input at time n charging capacitors with indices (k, (n−k) mod (N+1)), for k=0, . . . , N. Note that the charges on these capacitors after charging are proportional to the input voltage, but are independent of the filter coefficients at this point. Prior to coupling charges via the sharing node 234, scaled charges are determined from the charges on the capacitors with indices (k, n mod (N+1)), for k=0, . . . , N according to the desired filter coefficients $b_0$ to $b_N$.

As an example, the first charge scaling circuit 235 is configured to scale its input charge by the coefficient $b_0$. As is described in detail below, this scaling operation is performed using a sequence of charge sharing phases, resulting in a charge that is proportional to original charge on the memory capacitor times the coefficient $b_0$ being present on one or more capacitors that are then coupled to the sharing node 234. The scaled outputs of the charge scaling circuits are provided to the sharing node 234 which effectively combines the scaled charges, resulting in a numerator output 236, which effectively acts as a charge output proportional to $b_0 x[n] + b_1 x[n-1] + b_2 x[n-2]$.

The numerator output 236 is passed an output sharing node 237 where it is combined with a denominator output 239. The result of the output sharing node 237 is passed to the amplifier 238 where it is scaled according to the amplifier configuration instruction 229, generating the filtered output signal, y[n] 213.

As in the fixed IIR filter described above, the filtered output signal, y[n] 213 is passed out of the IIR filter 212 and is also fed back as an input to the denominator processor 224. The denominator processor 224 uses the inputs to implement the denominator portion of the IIR filter equation shown above (i.e., $-a_1 y[n-1]-a_2 y[n-2]$), resulting in the denominator output 239. The denominator processor 224 includes a second analog memory 240, N charge scaling circuits 244, 246, and a sharing node 248.

The second analog memory 240 has $N^2$ fixed capacitors, receives the filtered output signal, y[n] 213 as input, and stores a time series of samples of the filtered output signal, y[n] 213. In the IIR filter 212 of FIG. 3, the time series stored by the second analog memory 240 of the denominator processor 224 includes the present value of the filtered output signal 213, y[n], along with two previous values of the filtered output signal 213, y[n−1] and y[n−2]. y[n−1] and y[n−2] are each passed to a corresponding one of the charge scaling circuits 244, 246 along with the denominator configuration instruction 228. Based on the denominator configuration instruction 228, each charge scaling circuit 244, 246 is configured such that its received sample is scaled by a specific filter coefficient. In this example, the fourth charge scaling circuit 244 is configured to scale its input sample by the coefficient $a_1$ and the fifth charge scaling circuit 246 is configured to scale its input sample by the coefficient $a_2$. As was the case above, this scaling operation is performed using a sequence of charge sharing phases. The scaled outputs of the charge scaling circuits 244, 246 are provided to the sharing node 248 which combines the two outputs resulting in the denominator output 239. The denominator output 239 is equal to the denominator of the IIR filter equation, $-a_1 y[n-1]-a_2 y[n-2]$.

As is described above, the denominator output 239 is passed to the output sharing node 237 along with the numerator output 236. The result of the output sharing node 237 is scaled by the amplifier 238. Since charge sharing alone can only implement a limited set of filter coefficients, the amplifier 238 is used to provide a charge buffer or gain. For example, due to the nature of charge sharing, a coefficient of $b_0 \geq 1$ is not possible without the use of an amplifier 238. The resulting output signal is $$y[n]=b_0 x[n]+b_1 x[n-1]+b_2 x[n-2]-a_1 y[n-1]-a_2 y[n-2].$$

4 Detailed IIR Filter Architecture

Figure 4:
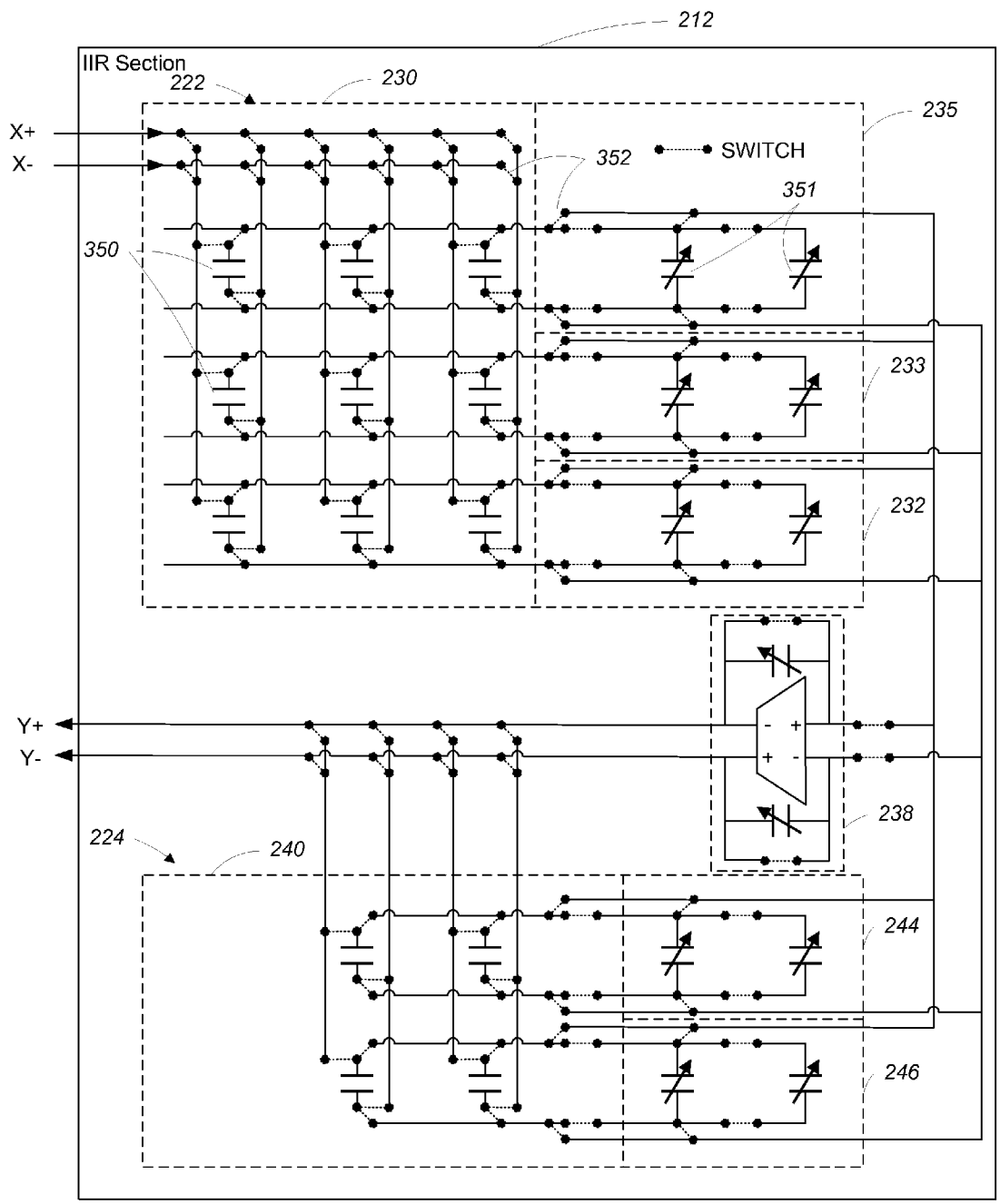
FIG. 4 is a detailed view of a configurable second order time domain IIR filter.

Referring to FIG. 4, a detailed architecture of the IIR filter 212 of FIG. 3 is illustrated. For the sake of simplicity, the digital controller 220 and its associated control signals are omitted from FIG. 4. Dashed lines are used to illustrate which portions of the architecture of FIG. 4 correspond specific modules shown in FIG. 3. In particular, the numerator processor 222 is shown enclosed by a group of connected boxes including a box enclosing the first analog memory 230, a box enclosing the first charge scaling circuit 235, a box enclosing the second charge scaling circuit 233, and a box enclosing the third charge scaling circuit 232. The amplifier 238 is shown enclosed by a separate box of dashed lines. The denominator processor 224 is shown enclosed by yet another group of connected boxes including a box enclosing the second analog memory 240, a box enclosing the fourth charge scaling circuit 244, and a box enclosing the fifth charge scaling circuit 246.

Each of the analog memories 230, 240 includes a number of fixed capacitors 350 which can be placed into various configurations using a number of switches 352. In some examples, the analog memories 230, 240 are square arrays of fixed capacitors 350 (i.e., including $(N+1)^2$ capacitors). Each of the charge scaling circuits 235, 233, 232, 244, 246 includes a number (e.g., 2) of configurable capacitors 351 which are coupled to the capacitors 350 of the analog memories and can be placed into various configurations using a number of switches 352. The configurable capacitors 351 are configurable to represent a number of different capacitance values. For example, a configurable capacitor 351 may actually include six capacitors with capacitance values differing by a power of two, each capable of switching into or out of a parallel combination with the others. In such an example, a six bit configuration word can be used to specify the capacitance value of the configurable capacitor.

In some examples, the amplifier 238 is a differential amplifier which outputs both a positive version of the difference between its two inputs and a negative version of the difference between its two inputs.

In general, the IIR filter 212 computes the filtered output signal, y[n] 213, in four separate phases: an analog memory loading phase, a first charge scaling phase, a second charge scaling phase, and a read phase. In some examples, the IIR filter 212 includes a configuration memory (not shown) which stores configuration instructions/data 107 (e.g., in flash or volatile digital memory) from the filter configuration module 106. The configuration instructions/data 107 are used to configure the switches of the IIR filter 212, causing it to cycle through the four phases. Furthermore, the configuration instructions/data 107 may include configuration words for configuring the capacitors of the charge scaling circuits. For example, as the charge scaling circuits cycle through a number of charge scaling phases, the configuration words can be read from the flash memory and used to configure the capacitance of the capacitors.

In some examples, logic circuitry (not shown) is included in the IIR filter 212 for the purpose of configuring the switches and capacitors according to the configuration instructions/data stored in the configuration memory.

Each phase is briefly described below and then a detailed example is presented.

4.1 Load Analog Memory Phase

Figure 5:
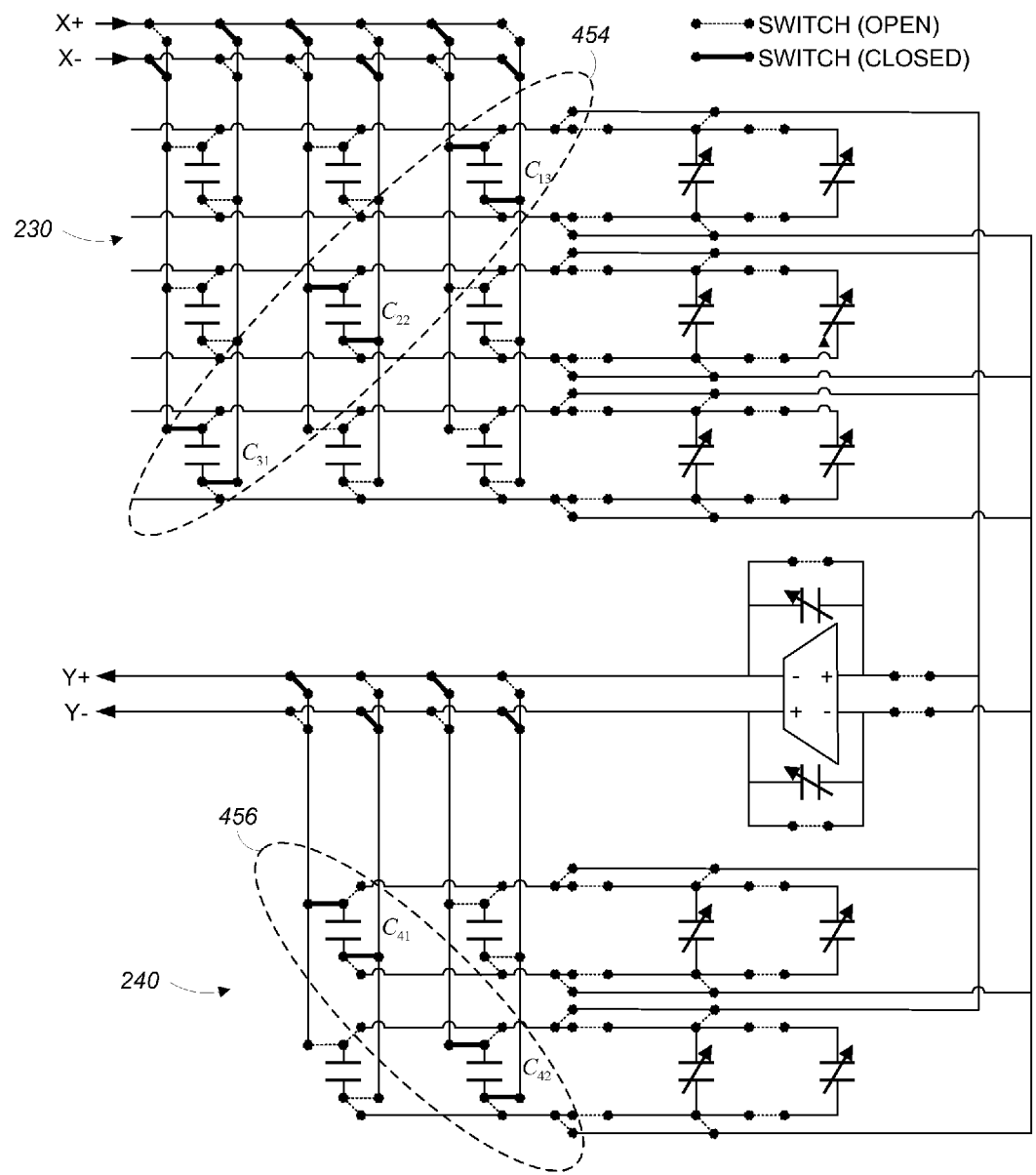
FIG. 5 illustrates a memory loading phase of a configurable second order time domain IIR filter.

Referring to FIG. 5, one example of loading the analog memories 230, 240 is illustrated. In this example, the first analog memory 230 is a $(N+1)^2$ array of capacitors and the second analog memory 240 is a $N^2$ array of capacitors.

To load the first analog memory 230, a diagonal line of capacitors 454 (i.e., a line crossing through $C_{13}$, $C_{22}$, and $C_{31}$) of the first analog memory 230 is charged by closing switches such that the terminals of the capacitors are electrically connected to the X+ and X− signal lines. This causes application of the input voltage to the terminals of the capacitors which in turn places a charge on the capacitors. Since $C_{13}$, $C_{22}$, and $C_{31}$ all have the same capacitance, the same charge is loaded onto $C_{13}$, $C_{22}$, and $C_{31}$. In subsequent load phases the diagonal line of capacitors 454 to be loaded shifts, causing a different set of capacitors to be charged. When the diagonal line of capacitors 454 reaches the end of the first analog memory 230, the line wraps back around to the beginning of the first analog memory 230. In this way, a time series of the input signal, X, is stored in the first analog memory 230.

To load the second analog memory 240, a second diagonal line of capacitors 456 (i.e., a line crossing through $C_{41}$ and $C_{42}$) of the second analog memory 240 is charged by closing switches such that the terminals of the capacitors are electrically connected to the Y+ and Y− signal lines. This causes application of the output voltage to the terminals of the capacitors which in turn places a charge on the capacitors. Since $C_{41}$ and $C_{42}$ each have the same capacitance, the same charge is loaded onto $C_{41}$ and $C_{42}$. In subsequent load phases the diagonal line of capacitors 456 to be loaded shifts, causing a different set of capacitors to be charged. When the diagonal line of capacitors 456 reaches the end of the second analog memory 240, the line wraps back around to the beginning of the second analog memory 240. In this way, a time series of the output signal, Y, is stored in the second analog memory 240. Note that multiple capacitors are charged with the same sample value due to the destructive nature of reading charge from capacitors for charge sharing phases.

Note that in this example, the X and Y signals are represented differentially, Thus, depending on which switches are closed, positive or negative charges can be placed on the capacitors of the analog memories 230, 240, according to the sign of the corresponding coefficients $b_k$ and $a_k$. For example, if $b_k<0$, then capacitors in the $k^{th}$ row are charged with inverted inputs.

4.2 First Charge Sharing Phase

Note that prior to the charge sharing phases, the capacitors of the charge sharing circuits are discharged using switches (not shown).

Figure 6:
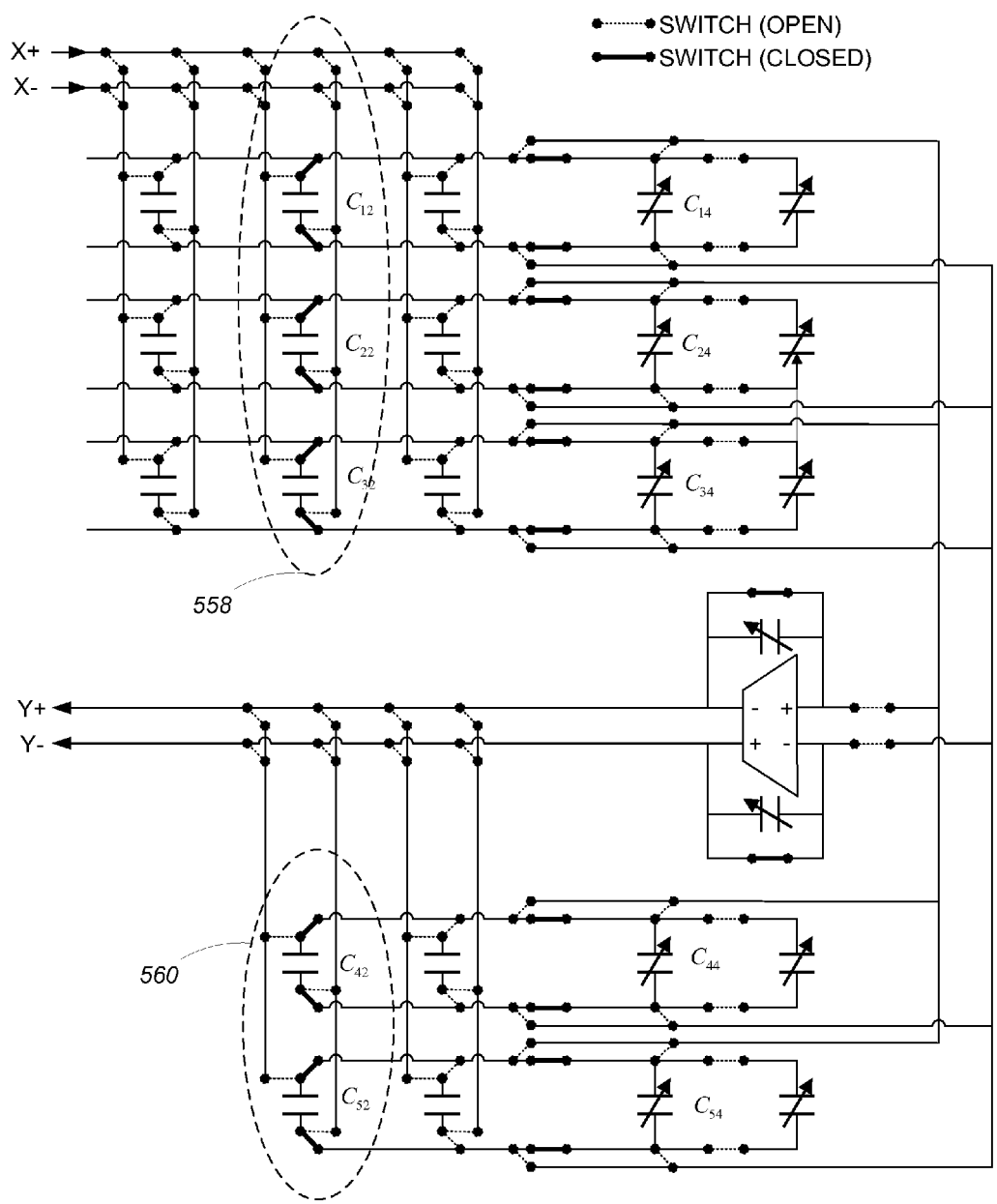
FIG. 6 illustrates a first charge transfer phase of a configurable second order time domain IIR filter.

Referring to FIG. 6, after the analog memories 230, 240 are loaded, the switches of the numerator and denominator processors 222, 224 are reconfigured to share charge between the capacitors of one column 558, 560 (each column representing a time series of the input or output signal) of each of the analog memories 230, 240 with a first capacitor $C_{14}$, $C_{24}$, $C_{34}$, $C_{44}$, $C_{54}$ of each of the charge scaling circuits 235, 233, 232, 244, 246.

For example, in the numerator processor 222, $C_{12}$ of the first analog memory 230 is placed in parallel with $C_{14}$ of the first charge scaling circuit 235, $C_{22}$ of the first analog memory 230 is placed in parallel with $C_{24}$ of the second charge scaling circuit 233, and $C_{32}$ of the first analog memory 230 is placed in parallel with $C_{34}$ of the third charge scaling circuit 232.

In the denominator processor 224, $C_{42}$ of the second analog memory 240 is placed in parallel with $C_{44}$ of the fourth charge scaling circuit 244 and $C_{52}$ of the second analog memory 240 is placed in parallel with $C_{54}$ of the fifth charge scaling circuit 246

Placing the capacitors in parallel as is shown in the figure causes the charge on the capacitors of the analog memories to be distributed (i.e., shared) between the capacitors of the analog memories and the capacitors of the charge scaling circuits. As is described in more detail below, the amount of charge which is transferred from the capacitors in the analog memories to the capacitors in the corresponding charge scaling circuits depends on the respective sizes of the capacitors.

4.3 Second Charge Sharing Phase

Figure 7:
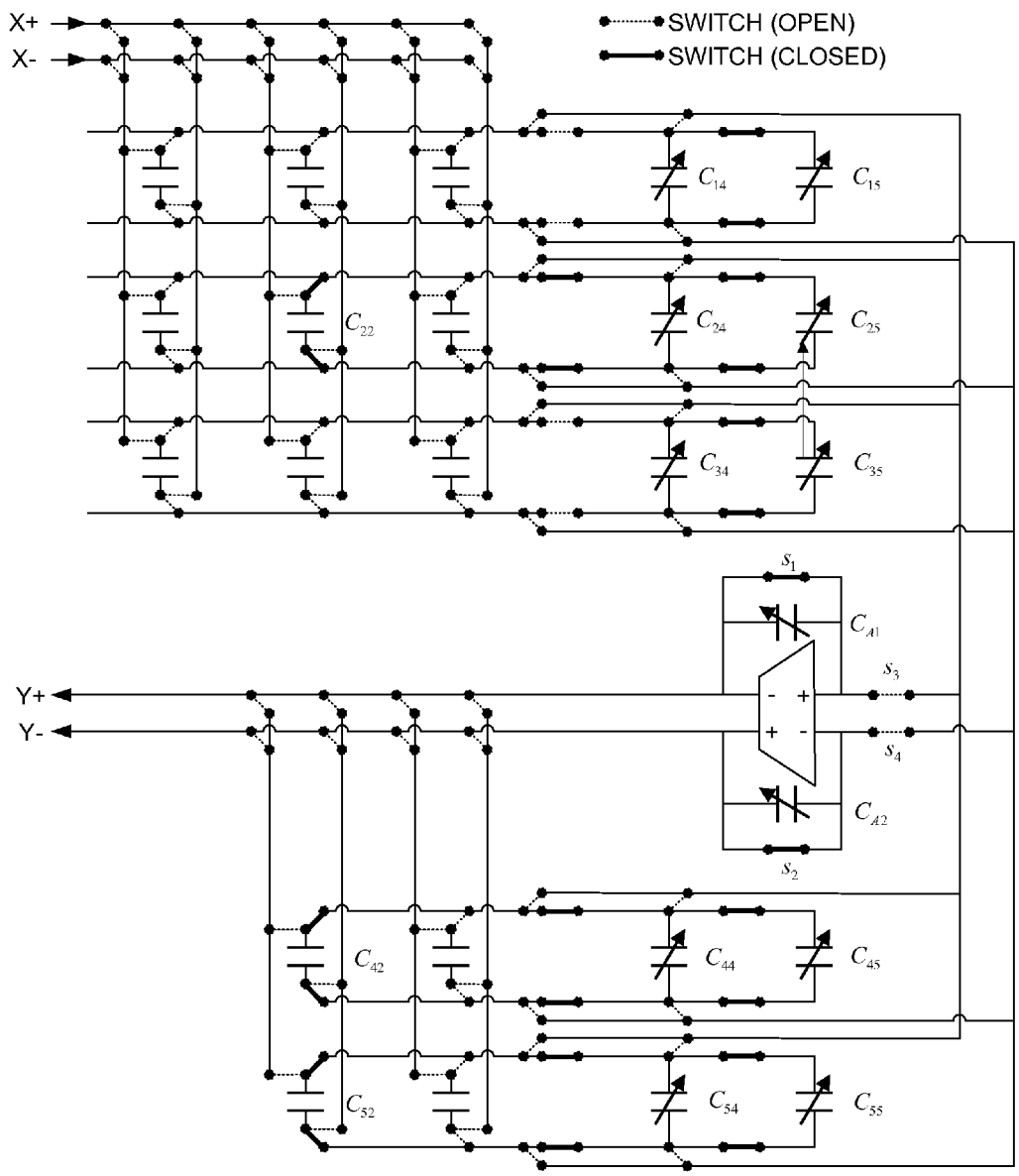
FIG. 7 illustrates a second charge transfer phase of a configurable second order time domain IIR filter.

Referring to FIG. 7, following the first charge sharing phase, the switches of the numerator and denominator processors 222, 224 are reconfigured to implement a second charge sharing phase. Two modes of the second charge sharing phase are possible and each charge sharing circuit can be configured to use a different mode.

In the first mode, switches of the numerator and denominator processors 222, 224 are reconfigured to share charge between the first capacitor (i.e., $C_{14}$, $C_{24}$, $C_{34}$, $C_{44}$, or $C_{54}$) of a charge scaling circuit 235, 233, 232, 244, 246 and a corresponding second capacitor (i.e., $C_{15}$, $C_{25}$, $C_{35}$, $C_{45}$, or $C_{55}$) of the charge scaling circuit 235, 233, 232, 244, 246. In the example of FIG. 7, the numerator processor 222 performs the first mode of the second charge sharing phase by configuring its switches such that $C_{14}$ and $C_{15}$ are placed in parallel with each other and by configuring its switches such that $C_{34}$ and $C_{35}$ are placed in parallel with each other.

In the second mode of the second charge sharing phase, switches of the numerator and denominator processors 222, 224 are reconfigured to share charge between a capacitor of the analog memories 230, 240 (e.g., $C_{12}$, $C_{22}$, $C_{32}$, $C_{42}$, or $C_{52}$), the corresponding first capacitor (i.e., $C_{14}$, $C_{24}$, $C_{34}$, $C_{44}$, or $C_{54}$) of the charge scaling circuits 235, 233, 232, 244, 246 and a corresponding second capacitor (i.e., $C_{15}$, $C_{25}$, $C_{35}$, $C_{45}$, $C_{55}$) of charge scaling circuits 235, 233, 232, 244, 246.

In the example of FIG. 7, the numerator processor 222 uses the second mode of charge sharing to place $C_{22}$ of the first analog memory 230 in parallel with $C_{24}$ and $C_{25}$ of the second charge scaling circuit 233. The denominator processor 224 uses the second mode of charge sharing to place $C_{42}$ of the second analog memory 240 in parallel with $C_{44}$ and $C_{45}$ of the fourth charge scaling circuit 244 and to place $C_{52}$ of the second analog memory 240 in parallel with $C_{54}$ and $C_{55}$ of the fifth charge scaling circuit 246.

As was the case above, placing the capacitors in parallel as is shown in the figure causes the charge on the capacitors distributed between each other. As is described in more detail below, the amount of charge which is transferred from one capacitor to another depends on the respective sizes of the capacitors.

4.4 Read Phase

Note that during the charge sharing phases, switches $s_1$ and $s_2$ discharge the capacitors of the amplifier 238.

Figure 8:
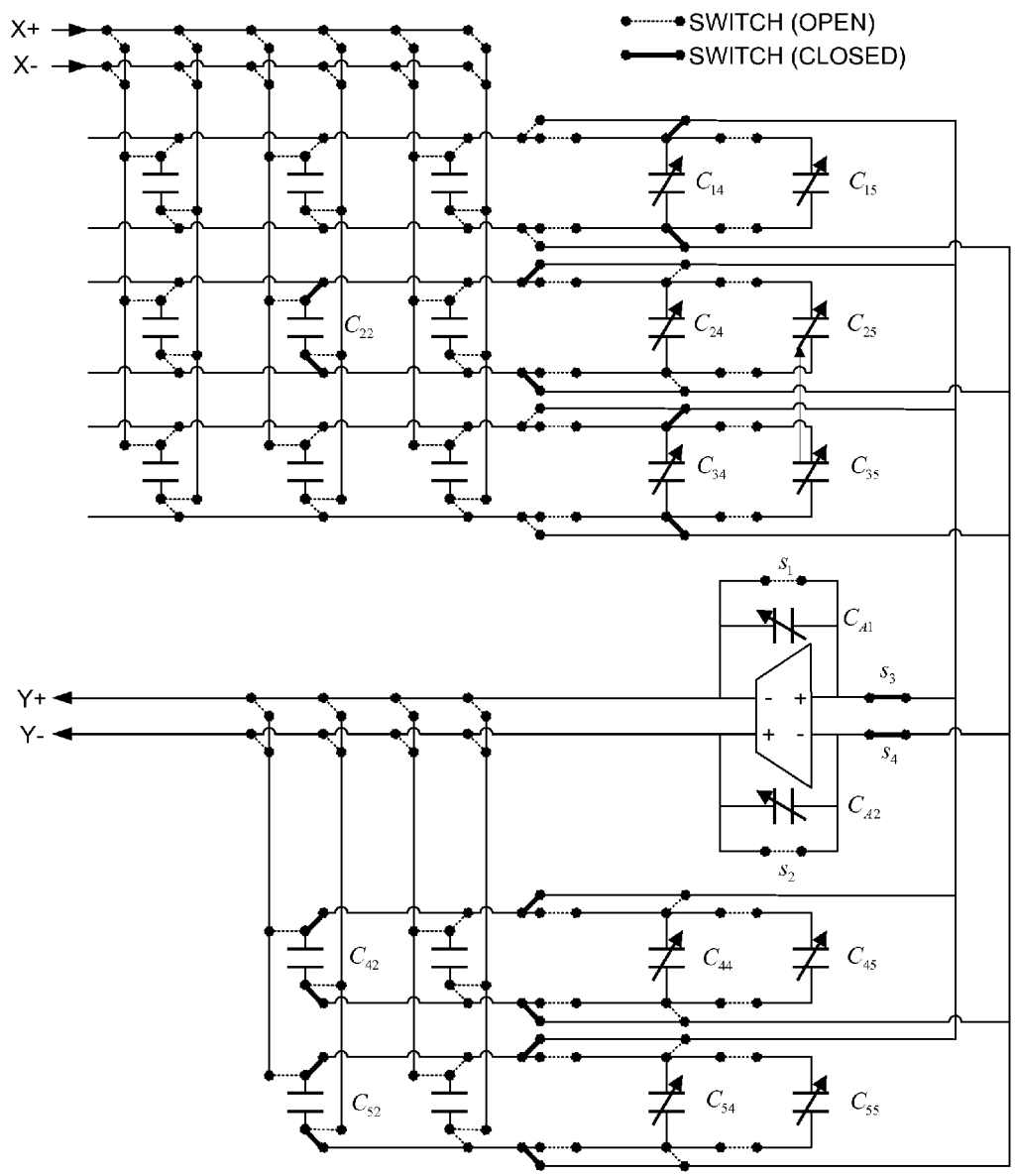
FIG. 8 illustrates an output phase of a configurable second order time domain IIR filter.

Referring to FIG. 8, following the second charge sharing phase, the switches of the numerator and denominator processors 222, 224 are reconfigured to read the scaled charges from each of the charge scaling circuits 235, 233, 232, 244, 246.

For each charge scaling circuit 235, 233, 232, 244, 246 the switches are configured to implement one of two read modes. The read mode is determined based on the mode of the second charge sharing phase for the charge scaling element. For example, if a particular charge scaling element previously executed the first mode of the second charge sharing phase, then the charge on the parallel combination of the first capacitor (i.e., $C_{14}$, $C_{24}$, $C_{34}$, $C_{44}$, $C_{54}$) of the charge scaling element and the second capacitor (i.e., $C_{15}$, $C_{25}$, $C_{35}$, $C_{45}$, $C_{55}$) of the charge scaling element is read as the scaled charge. If a particular charge scaling element previously executed the second mode of second charge sharing phase, then the charge on the parallel combination of a capacitor in one of the analog memories 230, 240 (e.g., $C_{12}$, $C_{22}$, $C_{32}$, $C_{42}$, $C_{52}$), the first capacitor (i.e., $C_{14}$, $C_{24}$, $C_{34}$, $C_{44}$, $C_{54}$) of the charge scaling element, and the second capacitor (i.e., $C_{15}$, $C_{25}$, $C_{35}$, $C_{45}$, $C_{55}$) of the charge scaling element is read as the scaled charge.

The scaled charges are read from the charge scaling circuits 235, 233, 232, 244, 245. The sum of the read charges is passed to the differential inputs of the amplifier 238.

During the read phase, the amplifier 238, by driving its differential input to zero, causes the total charge on the capacitors of the numerator and denominator processors coupled to its inputs to be transferred to the capacitors $C_{A1}$, $C_{A2}$ coupling its inputs and outputs. After the read phase, the input switches $s_3$, $s_4$ of the amplifier 238 are opened (i.e., in the next load phase) and the differential output of the amplifier 238 is a voltage proportional to y[n]. Note that the amplifier capacitors $C_{A1}$, $C_{A2}$ are themselves configurable, thereby controlling the magnitude of the gain of the amplifier 238.

4.5 Charge Scaling Circuit Examples 4.5.1 First Charge Scaling Circuit

Referring to FIGS. 9a-9d, an example of using the first charge scaling circuit 235 of FIG. 3 to scale an input voltage of 2.0V by a filter coefficient $b_0$=0.49215 is illustrated. Note that in FIG. 3, the charge sharing circuits are shown with two configurable capacitors each. In FIGS. 9a-9d, one capacitor configurable by setting a capacitance through selection of a set of (e.g., up to 6) capacitors that are multiples of powers of two of a base capacitance. The other capacitor similarly has a configurable capacitor, with the addition of an optionally configurable series capacitor ($C_c$). In the example presented below, the configured capacitances of the capacitors shown in the figure are $C_{13}$=3.0 pF, $C_{14}$=2.8 pF, $C_C$=0.5 pF, and $C_{15}$=0.2 pF. $C_C$ is a capacitor which can be configurably switched (i.e., according to the configuration instructions/data 207) into or out of the charge scaling circuit 235 for the purpose of providing additional scaling factors. The serial combination of $C_C$ and $C_{15}$ has an equivalent capacitance of 0.143 pF.

Before the capacitor of the analog memory (i.e., $C_{13}$) is loaded, the charges and voltages on all of the capacitors are assumed to be zero as is summarized in the following table:

|  | $C_{13}$ | $C_{14}$ | $C_{15} + C_C$ |
| --- | --- | --- | --- |
| Charge (pico-Coulombs) | 0 | 0 | 0 |
| Voltage (Volts) | 0 | 0 | 0 |

Referring to FIG. 9a, the capacitor in the first analog memory 230 is charged in the memory loading phase. In this phase a first switch 862 and a second switch 864 of the first analog memory 230 are closed, causing the input voltage of 2.0V to be applied to $C_{13}$. Applying 2.0V to $C_{13}$ results in a charge of 6.0 pC on $C_{13}$. Thus the summary of the charges and voltages on the capacitors is as follows:

|  | $C_{13}$ | $C_{14}$ | $C_{15} + C_C$ |
| --- | --- | --- | --- |
| Charge (pico-Coulombs) | 6.0 | 0 | 0 |
| Voltage (Volts) | 2.0 | 0 | 0 |

Referring to FIG. 9b, the first charge sharing phase includes opening the first and second switches 862, 864 and closing a third switch 865 and a fourth switch 866, causing charge sharing between $C_{13}$ and $C_{14}$. Upon completion of the first charge sharing phase, 2.8966 pC of charge are transferred from $C_{13}$ to $C_{14}$. The summary of charges and voltages on the capacitors after the first charge sharing phase is as follows:

|  | $C_{13}$ | $C_{14}$ | $C_{15} + C_C$ |
| --- | --- | --- | --- |
| Charge (pico-Coulombs) | 3.1034 | 2.8966 | 0 |
| Voltage (Volts) | 1.0345 | 1.0345 | 0 |

Referring to FIG. 9c, the first mode of the second charge sharing phase includes opening the third and fourth switches 865, 866 and closing a fifth switch 868, causing charge sharing between $C_{14}$ and the serial combination of $C_C$ and $C_{15}$. Upon completion of the second charge sharing phase, 0.141 pC of charge are transferred from $C_{14}$ to the serial combination of $C_C$ and $C_{15}$. The summary of charges and voltages on the capacitors after the second charge sharing phase is as follows:

|  | $C_{13}$ | $C_{14}$ | $C_{15} + C_C$ |
| --- | --- | --- | --- |
| Charge (pico-Coulombs) | 3.1034 | 2.756 | 0.141 |
| Voltage (Volts) | 1.0345 | 0.9842 | 0.9842 |

Referring to FIG. 9d, the read phase connects a sixth switch 870 to a read line 872. Thus, the charge on $C_{14}$ is shared onto read line 872. Note that shared charge is proportional to the input voltage (i.e., 2.0V) times the filter coefficient ($b_0$=0.4593).

4.5.2 Second Charge Scaling Circuit

Referring to FIGS. 10a-10d, an example of using the second charge scaling circuit 233 of FIG. 3 to scale an input voltage of 2.0V by a filter coefficient $b_1$=0.9137 is illustrated. In the example presented below, the configured capacitances of the capacitors shown in the figure are $C_{22}$=3.0 pF, $C_{24}$=0.2 pF, $C_C$=0.5 pF, and $C_{25}$=0.1 pF. As was the case above, $C_C$ is a capacitor which can be switched into or out of the charge scaling circuit 233 for the purpose of providing additional scaling factors. The serial combination of $C_C$ and $C_{25}$ has an equivalent capacitance of 0.083 pF.

Before the capacitor of the analog memory (i.e., $C_{22}$) is loaded, the charges and voltages on all of the capacitors are assumed to be zero as is summarized in the following table:

|  | $C_{22}$ | $C_{24}$ | $C_{25} + C_C$ |
| --- | --- | --- | --- |
| Charge (pico-Coulombs) | 0 | 0 | 0 |
| Voltage (Volts) | 0 | 0 | 0 |

Referring to FIG. 10a, the capacitor in the first analog memory 230 is charged in the memory loading phase. In this phase a first switch 962 and a second switch 964 of the first analog memory 230 are closed, causing the input voltage of 2.0V to be applied to $C_{22}$. Applying 2.0V to $C_{22}$ results in a charge of 6.0 pC on $C_{22}$. Thus the summary of the charges and voltages on the capacitors is as follows:

|  | $C_{22}$ | $C_{24}$ | $C_{25} + C_C$ |
| --- | --- | --- | --- |
| Charge (pico-Coulombs) | 6.0 | 0 | 0 |
| Voltage (Volts) | 2.0 | 0 | 0 |

Referring to FIG. 10b, the first charge sharing phase includes opening the first and second switches 962, 964 and closing a third switch 965 and a fourth switch 966, causing charge sharing between $C_{22}$ and $C_{24}$. Upon completion of the first charge sharing phase, 0.375 pC of charge are transferred from $C_{23}$ to $C_{24}$. The summary of charges and voltages on the capacitors after the first charge sharing phase is as follows:

|  | $C_{22}$ | $C_{24}$ | $C_{25} + C_C$ |
|---|---|---|---|
| Charge (pico-Coulombs) | 5.625 | 0.375 | 0 |
| Voltage (Volts) | 1.875 | 1.875 | 0 |

Referring to FIG. 10c, the second mode of the second charge sharing phase includes leaving the third and fourth switches 965, 966 closed and closing a fifth switch 968, causing charge sharing between $C_{22}$, $C_{24}$, and the serial combination of $C_C$ and $C_{25}$. Upon completion of the second charge sharing phase, 0.152 pC of charge are transferred from $C_{22}$ and $C_{24}$ to the serial combination of $C_C$ and $C_{25}$. The summary of charges and voltages on the capacitors after the second charge sharing phase is as follows:

|  | $C_{22}$ | $C_{24}$ | $C_{25} + C_C$ |
|---|---|---|---|
| Charge (pico-Coulombs) | 5.482 | 0.365 | 0.152 |
| Voltage (Volts) | 1.8274 | 1.8274 | 1.8274 |

Referring to FIG. 10d, the read phase connects a sixth switch 974 to a read line 972 while leaving the third, fourth, and fifth switches 965, 966, 968 open.

Thus, the charge of 5.482 pC on $C_{22}$ is shared onto the read line 972. Note that the shared charge is proportional to the input voltage (i.e., 2.0V) times the filter coefficient ($b_0 = 0.9137 = 5.482$ pC/6.0 pC).

5 Alternatives

In the above examples, the loading and use of capacitors in the analog memories 230, 240 is described as being carried out in a regular pattern. However, in some examples, to address defects or mismatches in capacitors, the loading and use of the capacitors can be carried out in an irregular or pseudo-random pattern.

In some examples, additional elements (e.g., switches) are added to address parasitic capacitances, including capacitances of switch elements (e.g., switching transistors) which can disrupt the application of filter coefficients to signal samples.

In some examples, a filter designer may specify a filter characteristic using a computer program and then pass the specified filter characteristic to the filter configuration module which maps the filter characteristic to a configuration instruction which is usable by the IIR filter modules.

While the examples above describe second order IIR filters, other filter types are possible. For example, some filtering systems include IIR filters including only poles. In some examples, filtering systems may include higher order filters and the degree of the numerator and denominator polynomials are not required to be the same.

In some examples, the filter configuration module described above creates the configuration instructions/data by generating one or more configuration words for each charge sharing circuit. For example, a configuration word for a particular charge sharing circuit may be a 14 bit word which includes 6 bits for configuring a first capacitor, $C_1$, of the charge sharing circuit, 6 bits for configuring a second capacitor, $C_2$, of the charge sharing circuit, 1 bit for configuring the charge sharing mode of the charge sharing circuit, and 1 bit for configuring whether the additional capacitor, $C_C$, is coupled into the charge sharing circuit.

Note that with the switch configurations shown in FIG. 3, other modes of operation of the charge scaling circuit can be used, for example, with yet other combinations of switches being open and closed in two charge sharing phases, with more than two charge sharing phases, and/or with different selections of capacitors for reading on output. Furthermore, it should be understood that the particular circuit arrangements shown for the charge scaling circuits can be used, for example, with more than two configurable capacitors, which may also be arranged in a chain with intervening switches or provide full switchable connectivity between the capacitors.

Note that in the description of the detailed operation of the example of the system as illustrated in FIG. 8, a single read phase is used to transfer all the charge in the selected capacitors to the capacitors at the gain element. However, it should be using a single clock phase to transfer the charge, multiple clock phases can be used, and in each of these multiple phases different subsets of capacitors can transfer their charge. In another alternative, the read phase can be divided into a first phase in which all the capacitors are coupled so that they share their charge, without coupling them to the amplifier, thereby resulting in a common voltage on all the capacitors. In a second phase of the read phase, it is not necessary to couple all the capacitors to the amplifier, and by selecting a subset of the capacitors, a selectable gain reduction can be achieve so that the effective gain is based not only on the configuration of the capacitors at the amplifier, but also the selection of the capacitors for transfer of charge to the amplifier capacitors.

In some examples, the gain of the amplifier described above can be offset with the denominator coefficients. For example, all of the denominator coefficients, a, can be scaled by $1/\max(|a|)$ and the gain of the amplifier can be $\max(|a|)$, yielding the same filter characteristic thereby avoiding scaling change by factors that are greater than 1 or by very small factors. Note an overall scaling of the transfer function can address the maximum magnitude of the numerator coefficients, which are therefore all assume to be less than or equal to 1 in magnitude.

In some examples, the coefficients implemented by the charge sharing circuits are represented digitally in the filter configuration system 106, and are transformed to configure the charge sharing circuit to achieve a linear relationship between a desired coefficient and a degree of charge transfer. For instance, a lookup table in the filter configuration system accepts a coefficient representation and provides outputs that configure the charge sharing circuit.

The configuration instructions/data can be provided in a number of different ways. In some examples, each charge sharing circuit include a volatile digital storage register and/or a fixed data register (e.g., metal layer ROM cells), as well as logic circuitry for combining the clock signal with stored values to control the switches. In some implementations, when the system is powered up, the values form fixed register are transferred to the volatile register, for example, to implement a default filter. In other examples, on powerup, the system retrieves the data to configure the circuits from an external memory, for example, over a serial connection. In some examples, the data values are set through control registers under external control.

In some examples, the filter configuration system 106 is implemented in software running on a workstation is used to determine configuration instructions/data which are subsequently used to configure the filtering circuits and systems described above. In some examples, the configuration instructions/data determined by the filter configuration system are transmitted directly to the filter system 100, while in other examples, the instructions/data (which essentially impart functionality to the filtering circuits and systems described above) are stored on a tangible media which is later used to transfer the configuration instructions/data to the filter system.

It is to be understood that the foregoing description is intended to illustrate and not to limit the scope of the invention, which is defined by the scope of the appended claims. Other embodiments are within the scope of the following claims.

What is claimed is:

1. A signal processing device for time domain filtering, comprising:
    an input for accepting a time series of input signal values;
    an analog signal storage section comprising a plurality of capacitors, the analog signal storage section comprising a first storage section having a first subset of the plurality of capacitors configured for selective charging according to the input signal values;
    a first plurality of scaling sections, each scaling section associated with a different part of the first storage section;
    switching circuit elements configurable to, for each time step of the time series of input signal values,
    couple at least one capacitor from the plurality of capacitors in the analog signal storage section and at least one capacitor from the first plurality of scaling sections to form an intermediate signal value; and
    circuitry for forming each of a plurality of output signal values of a time series of output signal values from a corresponding intermediate signal value.

2. The device of claim 1, wherein the analog signal storage section further comprises:
    a second storage section having a second subset of the plurality of capacitors, wherein the second subset of capacitors is configured for selective charging according to the intermediate signal values; and
    a second plurality of scaling sections, wherein each scaling section is associated with a different part of the second storage section.

3. The device of claim 2, further comprising active circuitry for charging the subsets of capacitors of the second storage section according to the intermediate signal values.

4. The signal processing device of claim 2, wherein, for each intermediate signal value, the switching circuit elements are further configurable to:
    (a) charge a group of the second subset of capacitors of the second storage section according to the intermediate signal value,
    (b) couple a capacitor from a first scaling section of the second plurality of scaling sections with a capacitor from the part of the second storage section associated with the second scaling section.

5. The signal processing device of claim 4, wherein, for each intermediate signal value, the switching circuit elements are further configurable to couple at least one capacitor from the second storage section and at least one capacitor from the second plurality of scaling sections to form the intermediate signal value.

6. The signal processing device of claim 1, further comprising control logic configured to form the time series of output signal values as an application of a finite-impulse-response (FIR) filter to the time series of input values.

7. The signal processing device of claim 1, further comprising control logic configured to form the time series of output signal values as an application of an infinite-impulse-response (IIR) filter to the time series of input values.

8. The signal processing device of claim 1, wherein the switching circuit elements are further configurable to, for each time step of the time series of input signal values, charge a subset of the capacitors of the first storage section according to the input signal value for the time step.

9. The signal processing device of claim 8, wherein the switching circuit elements are further configurable to, for each time step of the time series of input signal values, couple a capacitor from a first scaling section of the first plurality of scaling sections with a capacitor from the part of the first storage section associated with the first scaling section.

10. The signal processing device of claim 1, further comprising control logic for controlling configuration of the switching circuit elements to form the time series of output signal values.

11. The signal processing device of claim 10, wherein the control logic controls configuration of the switching circuit elements in successive phases of a clock signal.

12. The signal processing device of claim 10, wherein the control logic forms the time series of output signal values as an application of a filter to the time series of input signal values.

13. A method for operating a discrete time analog signal filter section of an integrated circuit in successive phases of a clock signal, the method comprising, for each time step of a series of input signal values:
    accepting an input signal value;
    in a first phase, configuring switching circuit elements to charge a subset of capacitors of a first storage section of an analog signal storage section according to the input signal value;
    in a second phase, at least one capacitor from the analog signal storage section and at least one capacitor from a first plurality of scaling sections to form an intermediate signal value; and
    forming an output signal value according to the intermediate value.

14. The method of claim 13, further comprising, for each formed intermediate signal value, configuring the switching circuit elements to
    charge a subset of capacitors of a second storage section of the analog signal storage section according to the intermediate signal value, and
    in a series of one or more phases, at least one capacitor from one of a second plurality of scaling sections with at least one capacitor from the second storage section.

15. The method of claim 13, wherein forming the output signal value includes forming a time series of output signal values and comprises forming said time series as an application of a finite-impulse-response (FIR) filter to the time series of input values.

16. The method of claim 13, wherein forming the output signal value includes forming a time series of output signal values and comprises forming said time series as an application of an infinite-impulse-response (IIR) filter to the time series of input values.

17. The method of claim 13, wherein configuring the switching circuit elements includes controlling configuration of the switching circuit elements in successive time steps to form a time series of output signal values as an application of a filter to the time series of input signal values.

18. A signal processing device for time domain filtering comprising:
    an input for accepting a time series of input signal values;
    an analog signal storage section comprising a plurality of capacitors, the analog signal storage section comprising a first storage section having a plurality of capacitors configured for selective charging according to the input signal values;

a first plurality of scaling sections, each scaling section associated with a different part of the first storage section;

means for forming an intermediate signal value using at least one capacitor from the plurality of capacitors in the analog signal storage section and at least one capacitor from the first plurality of scaling sections; and circuitry for forming each output signal value of a time series of output signal values from a corresponding intermediate signal value.

19. The signal processing device of claim 18, further comprising control logic configured to form the time series of output signal values as an application of a finite-impulse-response (FIR) filter to the time series of input values.

20. The signal processing device of claim 18, further comprising control logic configured to form the time series of output signal values as an application of an infinite-impulse-response (IIR) filter to the time series of input values.

* * * * *